United States Patent [19]

Yamada et al.

[11] 4,313,026
[45] Jan. 26, 1982

[54] MULTILAYER CIRCUIT BOARDS

[75] Inventors: Seiichi Yamada; Nobuo Kamehara, both of Machida; Kaoru Hashimoto, Yamato; Hiromitsu Yokoyama, Yokohama; Koichi Niwa, Tama; Kyohei Murakawa, Yokohama, all of Japan

[73] Assignee: Fujitsu Limited, Kawasaki, Japan

[21] Appl. No.: 88,467

[22] Filed: Oct. 26, 1979

[30] Foreign Application Priority Data

Nov. 8, 1978 [JP] Japan .................................. 53-137710

[51] Int. Cl.³ .............................................. H05K 1/03
[52] U.S. Cl. ............................ 174/68.5; 174/152 GM; 361/414
[58] Field of Search ...................... 174/68.5, 152 GM; 361/414

[56] References Cited

U.S. PATENT DOCUMENTS

| 2,885,826 | 5/1959 | Grieve et al. | 174/152 GM |
| 3,200,298 | 8/1965 | Garibotti | 361/414 |
| 3,312,870 | 4/1967 | Rhoades | 174/68.5 X |
| 3,423,517 | 1/1969 | Arrhenius | 174/68.5 |
| 3,723,176 | 3/1973 | Theobald et al. | 174/68.5 |
| 4,047,132 | 9/1977 | Kratjewski | 361/414 X |

OTHER PUBLICATIONS

Grubb, H. R., "Densely-Packaged Magnetic Film Memory", IBM Tech. Disc. Bull., vol. 14, No. 4, Sep. 1971, p. 1145.

Primary Examiner—Richard R. Kucia
Attorney, Agent, or Firm—Staas & Halsey

[57] ABSTRACT

A multilayer circuit board (10) for putting semiconductor devices thereon consists of conductor layers (6, 60, 61, 62, 63) made of a metal selected from the group consisting of Au, Ag, Cu and an alloy thereof, insulating material (2, 7) made of glass-ceramic and an alumina sintered plate (1). The glass-ceramic is comprised of borosilicate glass and alumina and has a low dielectric constant and a thermal expansion coefficient approaching that of the semiconductor devices. The alumina sintered plate (1) is placed between the ground and supply voltage conductor layers (62, 63) and the signal conductor layers (60).

13 Claims, 15 Drawing Figures

MULTILAYER CIRCUIT BOARDS

BACKGROUND OF THE INVENTION

1. Field of the Invention

The present invention relates to a multilayer circuit board which has a predetermined characteristic impedance and on which large scale integrations (LSIs), etc., are put.

2. Description of the Prior Art

Since a common semiconductor device of a beam-lead type or a flip chip type has active elements and/or passive elements within itself, the semiconductor generates heat. Accordingly, a multilayer circuit board on which such semiconductor devices generating heat are put should have the following requirements.

1. Good heat-resisting property.
2. Good heat dissipating property.
3. Obtaining a predetermined characteristic impedance for attaining the impedance matching between multilayer circuit boards and between a multilayer circuit board and the devices put on the board.
4. A small signal propagation delay time.
5. Accurate layer registration.
6. Small electric resistance of conductor layers.
7. A thermal expansion coefficient approaching that of the material, e.g. silicon, of the semiconductor devices generating heat, whereby generation of stress in contacting parts between the multilayer circuit board and the semiconductor devices is avoided.
8. Insulating material chemically stable against an ambient atmosphere and surrounding the conductor layers in an airtight manner.

Taking the above-mentioned requirements into consideration, a multilayer circuit board has been produced by two methods: (1) a laminating method; and (2) a thick film printing method.

In accordance with the laminating method, ceramic material powder, e.g. $Al_2O_3$, is mixed with an organic binder and formed into green sheets. Each of the green sheets is punched to make through holes, then printed with metal paste for a conductor circuit. All the green sheets are laminated and then sintered at an elevated temperature of 1350°–1600° C. to produce a multilayer laminated ceramic board. The multilayer laminated ceramic board produced by this method has the following disadvantages.

1. A conductor generates heat and because of this the conductor must be made of a high melting point material, e.g. Mo, W, which has a larger electric resistance than that of Au, Ag or Cu.
2. The signal propagation delay is large because the dielectric constant of the ceramic surrounding the signal conductor layers is high.
3. Thermal resistance is large because, to obtain a predetermined characteristic impedance between a ground conductor layer and the signal conductor layers, the thickness of insulating material (i.e. ceramic) between the ground and signal conductor layers is increased in proportion to the value of the dielectric constant.

In accordance with the thick film printing method, the paste for conductor layers (e.g. paste of Au, Ag or Cu) and the paste for insulating material (e.g. paste of glass, crystalline glass or glass-ceramic) are alternately printed on a fired ceramic plate by a screen process printing method to form an unfired multilayer circuit board. Then, the formed board is fired at a temperature of 700° to 1000° C. to produce a finished article. However, the multilayer circuit board produced by this method has the following disadvantages.

1. Thermal resistance is large because the thermal conductivity of the commonly used insulating material is small.
2. Because the commonly used insulating material has a high dielectric constant, the signal propagation delay is large.
3. The thermal resistance becomes larger because, in order to obtain a predetermined characteristic impedance, a thickness of insulating material between the ground conductor layer and the signal conductor layer is increased in proportion to the value of the dielectric constant.

SUMMARY OF THE INVENTION

It is an object of the present invention to provide an improved multilayer circuit board which has a smaller signal propagation delay and a better thermal dissipating property as compared with a prior art multilayer circuit board.

It is another object of the present invention to provide a multilayer circuit board which has a predetermined characteristic impedance and has a thinner total thickness thereof, as compared with a prior art multilayer circuit board.

These objects of the present invention are attained by providing a multilayer circuit board comprising a first multilayer circuit having a ground conductor and an insulator surrounding the ground conductor and a second multilayer circuit with signal conductors and an insulator surrounding the signal conductors, wherein the multilayer circuit board further comprises a central insulating layer which is provided between the first and second multilayer circuits and is made of insulating material having a larger thermal conductivity a larger dielectric constant than that of the insulator of the first and second multilayer circuits.

It is preferable that the above-mentioned first multilayer circuit includes a supply voltage conductor.

The above-mentioned insulator for the signal and ground conductors is a glass-ceramic comprising borosilicate glass and alumina and has a small dielectric constant and the above-mentioned central insulating layer is an alumina sintered plate.

Since the dielectric constant of the insulating material surrounding a signal conductor influences the signal propagation delay, according to the present invention, the dielectric constant of the insulator is reduced by using a borosilicate glass of which the dielectric constant is small, e.g. $\epsilon = 5.5$–$5.7$ (25° C., 1 $MH_z$), and thus the signal propagation delay is reduced. Furthermore, in order to obtain the desired characteristic impedance in a multilayer circuit board together with a good heat dissipation property of the board, according to the present invention, a suitable thickness of an alumina sintered plate, of which the dielectric constant is large, e.g. $\epsilon = 9.5$–$9.8$ (25° C., 1 $MH_z$), is used between the ground and supply voltage conductor layer and the signal conductor layers.

It is preferable to use gold, silver, copper or an alloy thereof as a material for the conductors, since the electric resistance of these metals is low and the melting points of these metals are higher than the firing temperature (approximately 900° C.) for the glass-ceramic of the multilayer circuit board.

DETAILED DESCRIPTION OF THE PREFERRED EMBODIMENTS

The present invention will be further clarified by the following Experiments and Example.

Experiments

It was found that borosilicate glass is suitable for the glass of a glass-ceramic insulating material, taking the following requirements into consideration.

1. The dielectric constant is small.
2. The other electric properties are excellent.
3. The thermal expansion coefficient is small.
4. The softening point is within the range of 700°–900° C.
5. The glass can be etched with an etchant containing hydrofluoric acid. Composition and properties of some kinds of borosilicate glass are indicated in Table 1. It was found that although there are many kinds of borosilicate glass, other than the three kinds of borosilicate glass indicated in Table 1, since Sample 1 has a small dielectric constant and a small thermal expansion coefficient, as seen from Table 1, Sample 1 is a preferable material.

TABLE 1

| Composition | Sample 1 wt % | Sample 2 wt % | Sample 3 wt % |
|---|---|---|---|
| $SiO_2$ | 70 | 67 | 80 |
| $B_2O_3$ | 26 | 22 | 12 |
| $Al_2O_3$ | 1 | 2 | 2 |
| $Na_2O$ | 1.5 | } 6.5 | 4 |
| $K_2O$ | 1.4 | | 0.2 |
| $CaO$ | 0.3 | — | 0.3 |
| $Li_2O$ | 0.3 | — | 0.7 |
| Dielectric constant | 4.1 | 4.9 | 4.8 |
| Thermal expansion coefficient | $3.2 \times 10^{-6}$ | $4.6 \times 10^{-6}$ | $3.2 \times 10^{-6}$ |

It was found that alumina is suitable for the ceramic material of a glass-ceramic insulating material, taking the following requirements into consideration.

1. The dielectric constant is large.
2. The thermal conductivity is large.
3. A chemical reaction does not take place with borosilicate glass.

Figure 1:
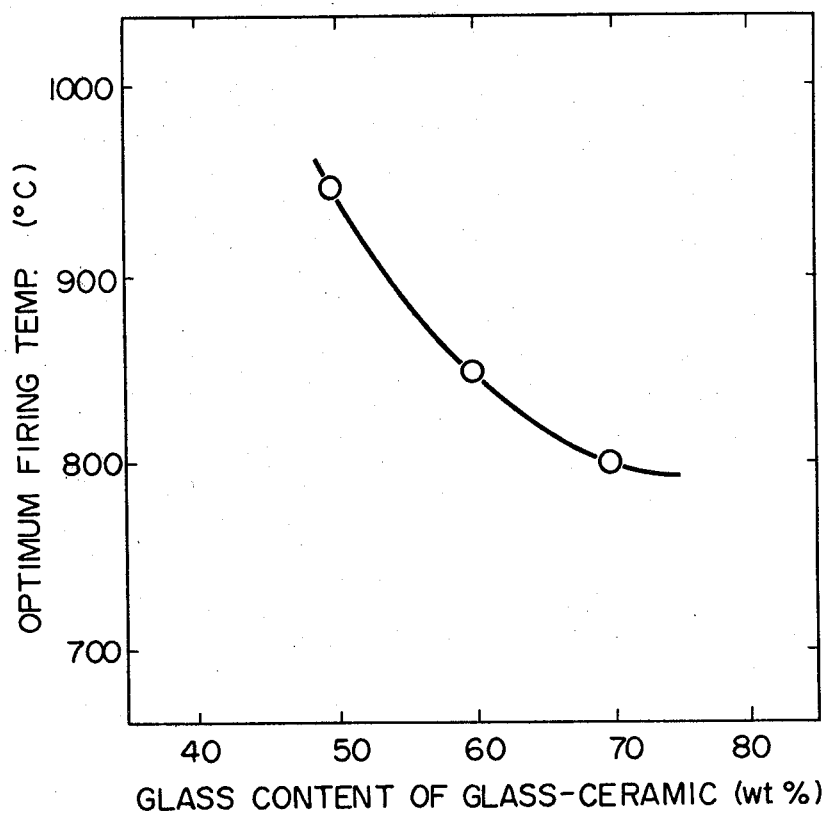
FIG. 1 shows optimum firing temperature as a function of the glass content of the glass-ceramic according to the present invention.
Figure 2:
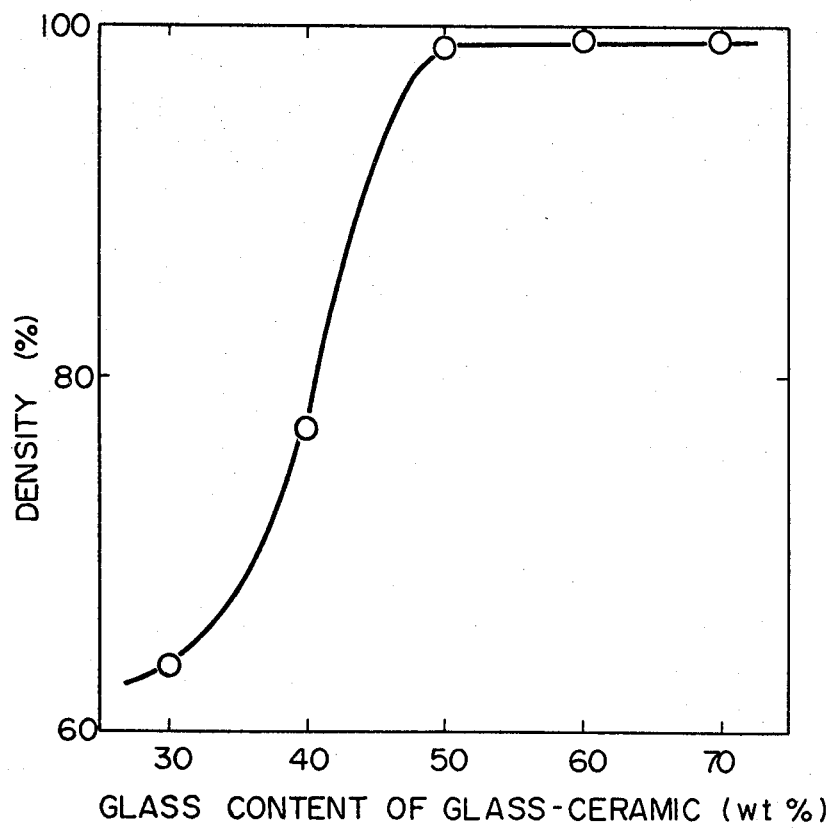
FIG. 2 shows the relative density of the glass ceramic of the present invention as a function of the glass content.
Figure 3:
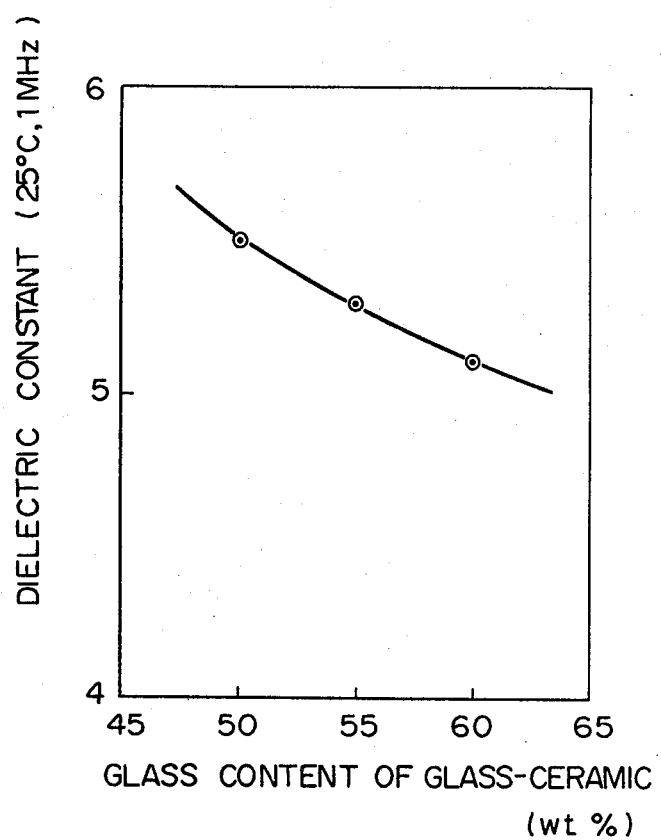
FIG. 3 shows the dielectric constant of the glass-ceramic of the present invention as a function of glass content.
Figure 4:
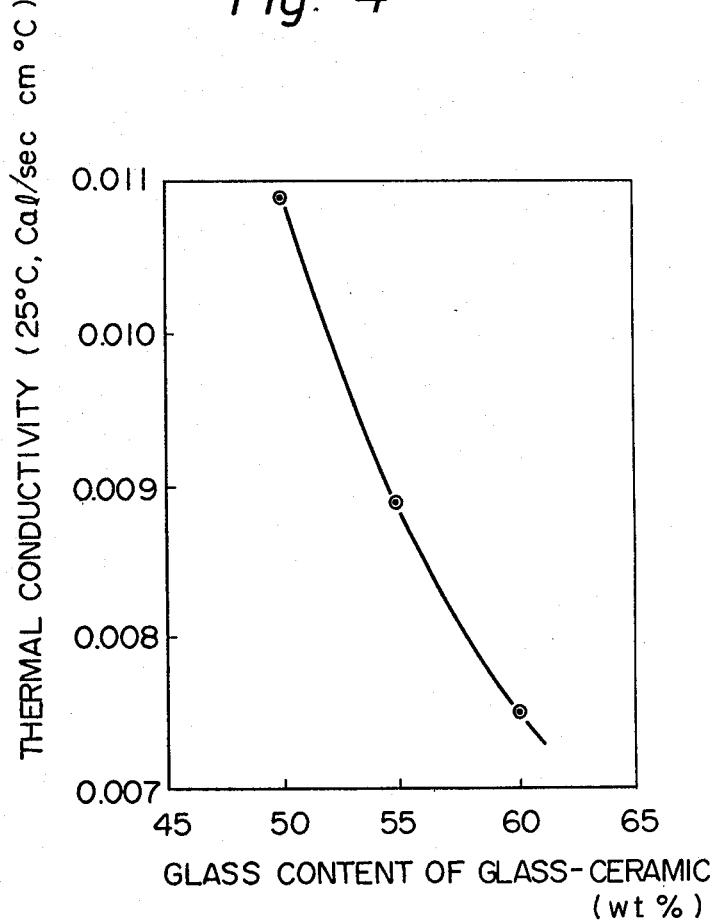
FIG. 4 shows the thermal conductivity of the glass-ceramic according to the present invention as a function of the glass content.

Glass-ceramic, according to the present invention, is produced by mixing borosilicate glass powder, alumina powder and a binder to form a paste, by forming an insulating layer of the paste by means of a screen process printing and then by firing the paste. The grain size of the alumina powder affects the density of the glass-ceramic. It was found that in the case of less than 1 μm of the average grain size of the alumina powder, the density of the glass-ceramic was not high enough and therefore the glass-ceramic absorbed water, and in the case of 3–5 μm of the average grain size, the density of the glass-ceramic was high enough and therefore it did not absorb water. Properties of the glass-ceramic vary depending upon the mixture ratio of alumina and borosilicate glass as indicated in FIGS. 1 through 4. FIG. 1 shows a relationship between the glass content of glass-ceramic and the optimum firing temperature. It is clear from FIG. 1 that the optimum firing temperature, i.e. the necessary temperature for increasing the density of the glass-ceramic to a level which is sufficient for preventing the glass-ceramic from absorbing water, falls as the glass content increases. FIG. 2 shows a relationship between the glass-content of glass-ceramic and the density of glass-ceramic at the optimum firing temperature. It is clear from FIG. 2 that at least 50 wt % of the glass content can ensure a high density of the glass-ceramic. FIGS. 3 and 4 show a relationship between the glass content of glass-ceramic and the dielectric constant and a relationship between the glass content of glass-ceramic and the thermal conductivity, respectively. It is clear from FIGS. 3 and 4 that the dielectric constant and the thermal conductivity are decreased as the glass content increases. Furthermore, the thermal expansion coefficient and the flexural strength of the glass-ceramic are reduced as the glass content of the glass-ceramic increases. Taking the above mentioned facts into consideration, it was found that the most preferable glass-ceramic consisted of 50 wt % of borosilicate glass having the composition of Sample 1 in Table 1 and 50 wt % of alumina and was fired at approximately 900° C. Concerning the firing time, in this case at the temperature of 900° C., it was found that the density of glass-ceramic could be increased to a high level by firing for at least 5 minutes and that the obtained high level density was hardly increased by continuing the firing for some hours. This preferable glass-ceramic has properties indicated in Table 2.

TABLE 2

| Properties | Value |
|---|---|
| Specific gravity | 2.70 |
| Water absorption (%) | 0 |
| Dielectric constant (25° C., 1MHz) | 5.5 |
| Dielectric loss (25° C., 1MHz) | 0.0026 |
| Volume resistivity (25° C., Ω-cm) | $>1 \times 10^{16}$ |
| Temperature coefficient of dielectric constant (ppm/°C.) | 120 |
| Thermal conductivity (cal/sec, cm °C.) | 0.01 |
| Thermal expansion coefficient (25 ~ 400° C., $1 \times 10^{-6}$/°C.) | 4.5 |
| Flexural strength (kg/cm$^2$) | 2000 |

The thermal expansion coefficient of the glass-ceramic is near that of single crystalline silicon, which is used as a substrate of a semiconductor device and is fixed on the surface of the glass-ceramic. Accordingly, stress generated in contacting parts of the glass-ceramic and silicon substrate by the difference between the thermal expansion coefficients is small.

It is preferable that an alumina sintered plate, according to the present invention, be made of alumina ($Al_2O_3$) having a purity of more than 90% and having a density of more than 95%, taking the following facts into consideration.

Figure 5:
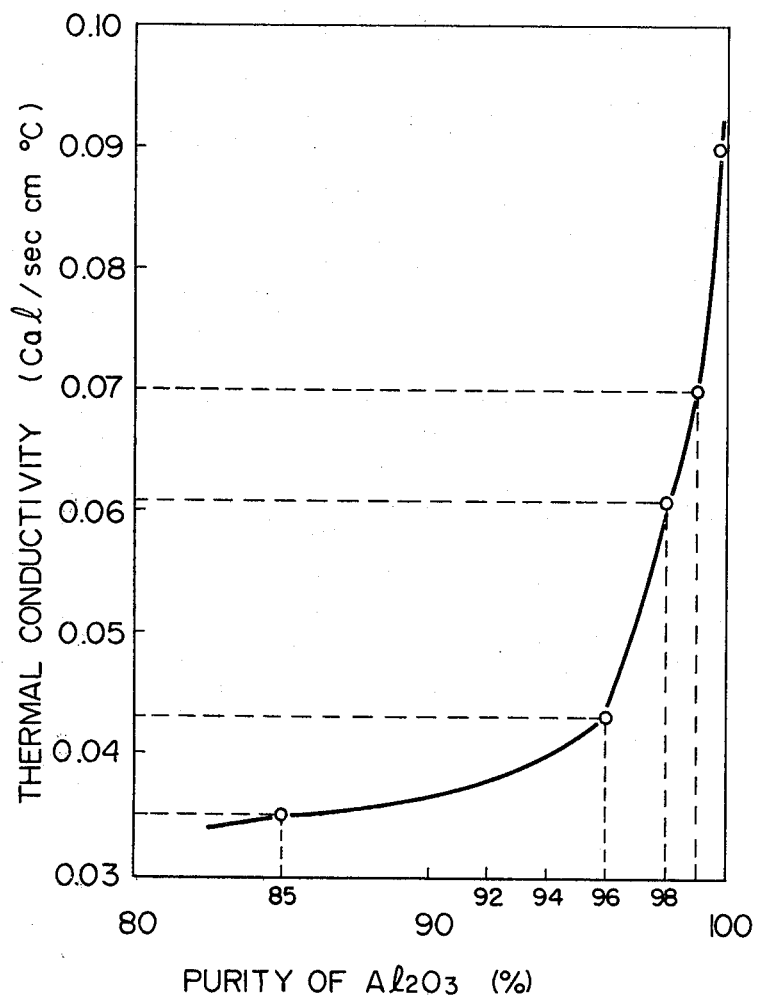
FIG. 5 shows the thermal conductivity as a function of purity for alumina according to the present invention.
Figure 6:
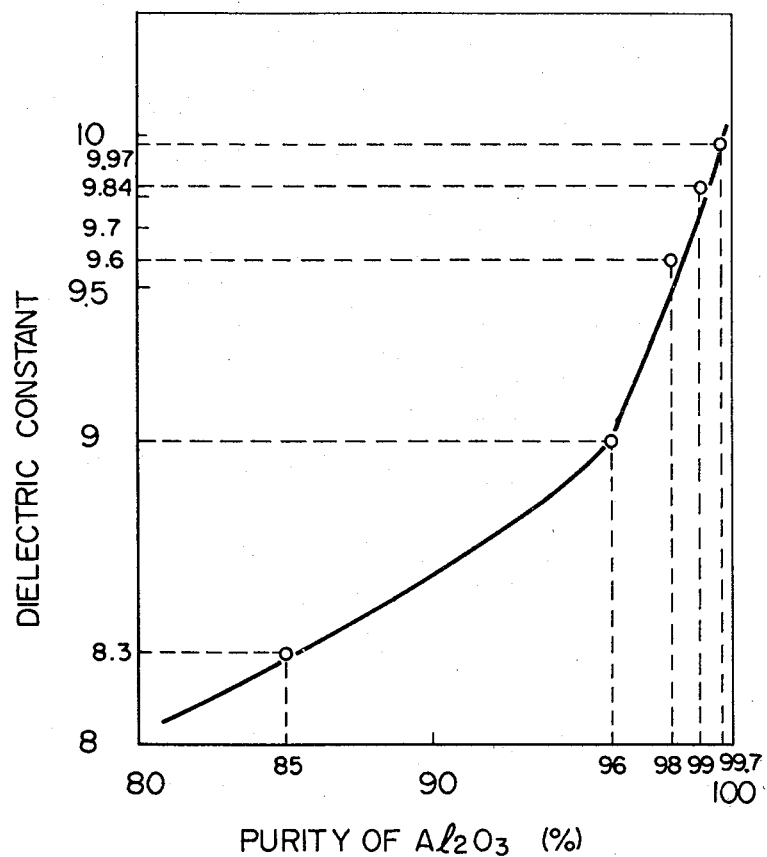
FIG. 6 shows the dielectric constant as a function of purity for alumina according to the present invention.
Figure 7:
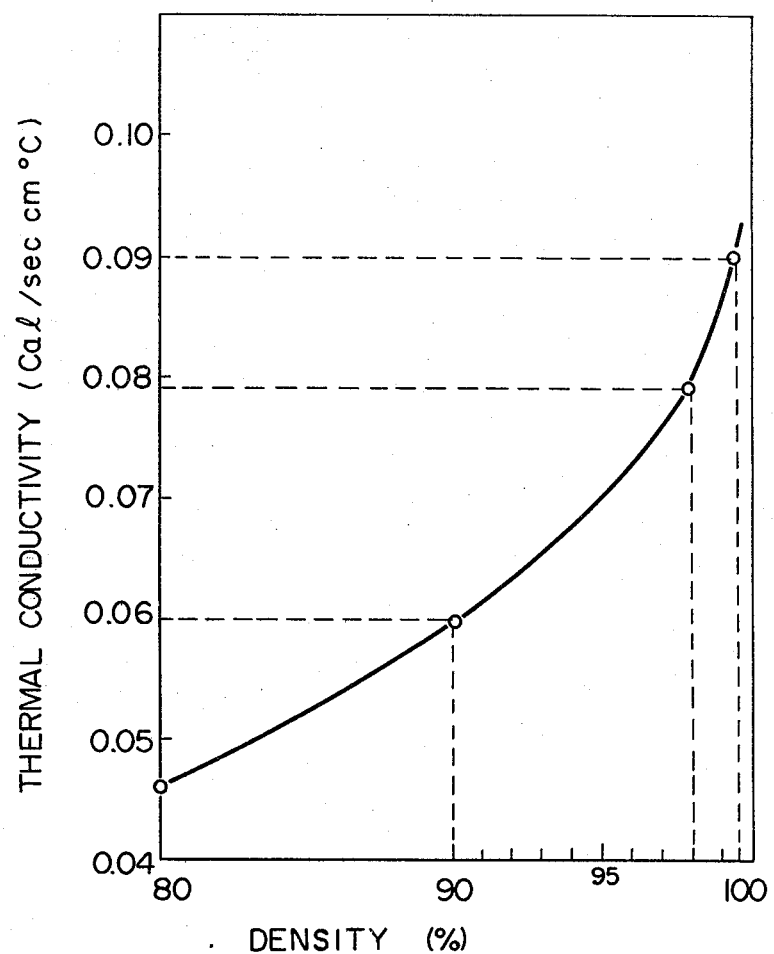
FIG. 7 shows the thermal conductivity as a function of density of the glass-ceramic according to the present invention.

FIGS. 5 and 6 show the relationship between the purity of $Al_2O_3$ and the thermal conductivity of an alumina sintered plate and the relationship between the purity of $Al_2O_3$ and the dielectric constant, respectively. Taking the requirements for an alumina sintered plate in a multilayer circuit board and FIGS. 5 and 6 into consideration, the purity of $Al_2O_3$ should not be less than 90%. Furthermore, FIG. 7 shows the relationship between sintered density and thermal conductivity of an alumina sintered plate made of alumina having a purity of 99.7%. Since alumina sintered plates having a density of less than 95% had some degree of water absorption, an alumina sintered plate to be used for the multilayer circuit board of the present invention needs a density of more than 95%.

Since a thermal expansion coefficient of the glass-ceramic is smaller than that of the alumina sintered plate, such a difference of the thermal expansion coefficient may generate a camber of a multilayer circuit board. However, the generation of a camber can be prevented by forming the same thickness of the glass-ceramic layers on both surfaces of the alumina sintered plate.

EXAMPLE

FIGS. 8a through 8h are schematic, cross-sectional views of a multilayer circuit board according to the present invention in various stages of its production.

Figure 8A:
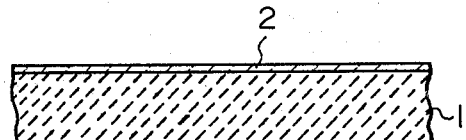
FIGS. 8a through 8h show the steps of manufacturing an insulating substrate with multilayer conductors according to the present invention.

Stage 1 (See FIG. 8a)

On both surfaces of an alumina sintered plate 1 glass-ceramic paste layers 2, 2' were entirely applied by means of a conventional screen process printing and then fired at 900° C. for 10 minutes to form glass-ceramic layers 2, 2' being 25 μm thick. The alumina sintered plate used was 80 mm wide, 80 mm long and 0.60 mm thick and was made of a purity of 99.7% of alumina. The glass-ceramic paste used was produced by mixing borosilicate glass powder and alumina powder in the ratio of 51:49 (weight), adding a binder and the solvent indicated in Table 3 at a ratio of 94 g per 100 g of the mixed powder into the mixed powder, mixing them for approximately 20 hours and then evaporating the methyl ethyl ketone. Since the above mixing was carried out in a ball mill in which alumina balls are contained, the weight ratio of the glass powder and the alumina powder in the obtained paste became 1:1. The borosilicate glass powder used had a grain size of 325 mesh and a composition of Sample 1 indicated in Table 1. The alumina powder used had an average grain size of 3.5 μm and a purity of 99.7%.

TABLE 3

| Component | Weight (g) |
| --- | --- |
| Ethyl cellulose | 2 |
| Polyoxyethylenealkylamine | 2 |
| Terpineol | 60 |
| Methyl ethyl ketone | 30 |

Figure 8B:
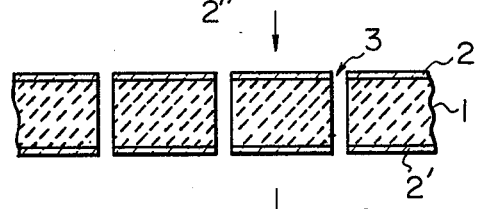

Stage 2 (see FIG. 8b)

Holes 3 (i.e. via holes) were made in the alumina sintered plate 1 with the glass-ceramic layers 2, 2' by using a laser. The holes 3 made had a diameter of 100 μm.

Figure 8C:
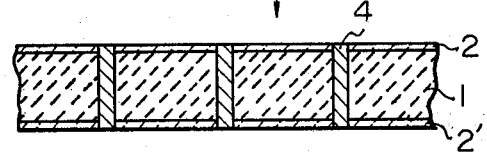

Stage 3 (see FIG. 8c)

The holes 3 were filled with gold (Au) conductor paste 4 and then the paste 4 was fired at 900° C. for 10 minutes. The Au conductor paste used was produced by adding the borosilicate glass of Sample 1 of 2 wt % into commercial 99% Au paste. The addition of borosilicate glass was carried out in order to increase the bond strength between the Au conductor being formed and the alumina sintered plate or the glass-ceramic.

Figure 8D:
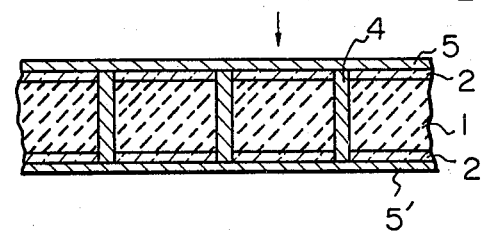

Stage 4 (see FIG. 8d)

Layers 5, 5' of the above-mentioned Au conductor paste were applied on both entire surfaces of the formed glass-ceramic layers 2, 2' by means of a screen process printing and then fired at 900° C. for 10 minutes. As a result, conductor layers 5, 5' being 15 μm thick were formed.

Figure 8E:
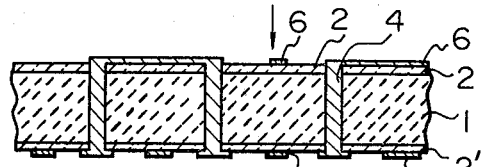

Stage 5 (see FIG. 8e)

The formed conductor layers 5, 5' were etched by a conventional photo etching process to form conductor circuits 6, 6' having a conductor width of 50 μm and a conductor spacing of 50 μm. As to the photo etching process, positive type photo resist and etchant containing potassium iodide-iodine ($KI-I_2$) were used.

Figure 8F:
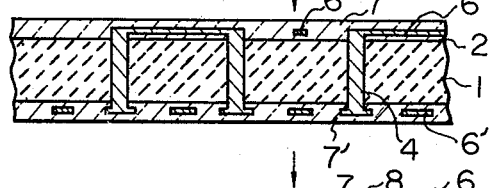

Stage 6 (see FIG. 8f)

The glass-ceramic paste described in Stage 1 was applied on both entire surfaces of the formed conductor circuits 6, 6' and the formed glass-ceramic layers 2, 2' by means of the screen process printing method and then fired at 900° C. for 10 minutes to form glass-ceramic layers 7, 7' being 25 μm thick (on the conductor). It is possible to form glass-ceramic layers 7, 7' by repeating the application and the firing of the glass-ceramic paste two times. In this case, the first firing time may be 1–2 minutes.

Figure 8G:
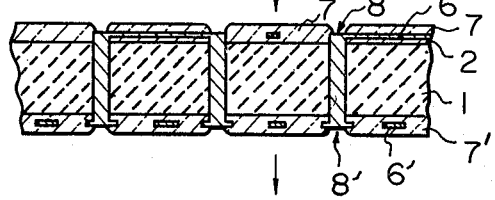
Figure 8H:
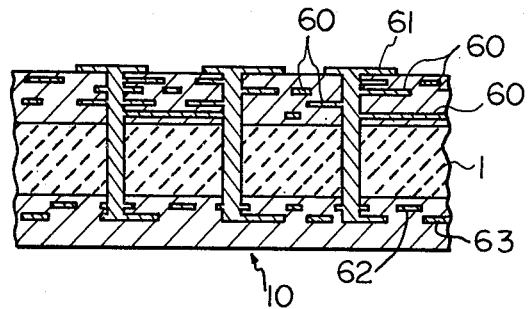

Stage 7 (see FIG. 8g)

The formed glass-ceramic layers 7, 7' were etched by a conventional photo etching process to make via holes 8, 8' having a diameter of 100 μm. The etching was carried out by using a negative type photo resist and an etchant containing hydrogen fluoride-sulfuric acid ($HF-H_2SO_4$).

Thereafter, Stages 3 through 7 were repeated to produce a multilayer circuit board 10 (FIG. 8h) having seven conductor layers. The seven conductor layers consisted of four signal layers 60, one surface layer 61, one ground layer 62 and one supply voltage layer 63. The conductor thus formed had an electric resistivity of 500 mΩ/cm. In order to compare properties of the multilayer circuit board thus produced according to the present invention with properties of a multilayer circuit board of the prior art, the latter board was produced by the above mentioned laminating method. The latter board consisted of ceramic made of alumina having a purity of 92% and seven conductor layers made of tungsten (W) therein.

Dimensions of the multilayer circuit boards thus produced according to the present invention and the prior art are indicated in Table 4.

TABLE 4

|  | Present invention | Prior art |
|---|---|---|
| Conductor width (μm) | 50 | 100 |
| Conductor thickness (μm) | 15 | 20 |
| Distance between ground and signal layers (μm) | glass-ceramic 50 alumina plate 600 | 1140 |
| Board thickness (mm) | 0.98 | 2.34 |
| Board width (mm) | 80 | 80 |
| Board length (mm) | 80 | 80 |

Properties of the insulating material used in the multilayer circuit boards thus produced are indicated in Table 5.

TABLE 5

| Properties | Present invention alumina plate | Present invention glass-ceramic | Prior art ceramic |
|---|---|---|---|
| Dielectric constant (25° C., 1 MHz) | 9.8 | 5.5 | 9.0 |
| Thermal conductivity (W/cm °C.) | 0.378 | 0.042 | 0.189 |

Accordingly, the properties (characteristic impedance, signal propagation delay and thermal resistance) of the multilayer circuit boards according to the present invention and the prior art can be calculated from the following equations (1) (2) and (3) by substituting the values indicated in Tables 4 and 5 into the equations.

$$Z_o = \frac{87}{\sqrt{\epsilon + 1.41}} l_n \frac{5.98 h}{0.8 W + t} \quad (1)*$$

Note (*) Otsuka and Murakami, Electronic Parts and Materials (monthly publication), Vol. 18 No. 6, P 103, FIG. 7 wherein
Zo: characteristic impedance,
ε: dielectric constant between ground and signal conductor layers,
h: distance between ground and signal conductor layers,
w: conductor width, and;
t: conductor thickness.

$$\tau_d = \sqrt{\frac{\epsilon}{c}} \quad (2)$$

wherein
$\tau_d$: signal propagation delay
ε: dielectric constant of insulating material surrounding a signal conductor layer, and;
c: speed of light.

$$R_T = \frac{d}{\lambda A} \quad (3)$$

wherein
$R_T$: thermal resistance,
d: board thickness,
λ: thermal conductivity of board, and;
A**: area of heat generating object.
Note (**)36 mm² (used LSI being 6 mm wide and 6 mm long)

The calculated value of the properties are indicated in Table 6.

TABLE 6

| Properties | Present invention | Prior art |
|---|---|---|
| Characteristic impedance (Ω) | 113 | 113 |
| Signal propagation delay (n . sec/m) | 7.8 | 10.0 |
| Thermal resistance (°C./w) | 2.9 | 3.5 |

It is obvious from the above mentioned results of the Example that the multilayer circuit board of the present invention has a smaller signal propagation delay and a better heat dissipation property (i.e. a thinner board thickness and a smaller thermal resistance) as compared with the multilayer circuit board having the same width and length as those of the former board produced by the laminating method of the prior art.

What is claimed is:

1. A multilayer circuit board comprising a first multilayer circuit including at least a ground conductor and an insulator surrounding said ground conductor, a second multilayer circuit including a plurality of signal conductors and an insulator surrounding said signal conductors, a central insulating layer between said first and said second multilayer circuits of a material having a larger thermal conductivity and a higher dielectric constant than those of said insulator of said first and second multilayer circuits, said insulator of said first and second multilayer circuits comprising a glass-ceramic comprising a mixture of at least approximately 50% by weight of borosilicate glass in alumina, said glass-ceramic having sufficient density as to be non-water absorbing, and said central insulating layer comprising a sintered plate of alumina having a purity of at least 90% and a density of at least 90%.

2. A multilayer circuit board as claimed in claim 1, said ground and signal conductors comprising a metal selected from the group consisting of gold, silver, copper and an alloy thereof.

3. The board of claim 1, said glass-ceramic comprising a paste mixture of borosilicate glass powder, alumina powder and a binder that is fired at approximately 900° C.

4. The board of claim 3, said glass-ceramic on at least one side of said alumina plate comprising plural layers of said glass-ceramic and a selectively patterned conductor layer located between each adjacent pair of said plural layers of glass-ceramic.

5. The board of claim 1 or 2, comprising at least one extension of one of said conductors through said central insulating layer to provide at least one respective common voltage in both said first and second multi-layer circuits.

6. The board of claim 3, said glass-ceramic comprising the result of said firing at a temperature between 800° and 950° C.

7. The board of claim 6, said glass-ceramic being the product of conducting said firing at a maximum temperature of approximately 900° C.

8. The board of claim 1, said central insulating layer comprising a dielectric constant higher than 8.5 and a thermal conductivity of greater than 0.06 cal/sec cm° C.

9. The board of claim 1, said alumina of said mixture comprising a grain size in the range from 3 to 5 microns prior to said firing.

10. The board of claim 7 or 8 comprising the result of said firing for a period as short as 5 minutes.

11. The board of claim 8, said central insulating layer comprising a dielectric constant higher than 9.0 and a thermal conductivity higher than 0.043 cal/sec cm° C.

12. The board of claim 1 or 8, said glass-ceramic of said multilayer circuit having a dielectric constant less than 5.5 and a thermal conductivity less than 0.011 cal/sec cm° C.

13. The board of claim 4, said glass-ceramic of said multilayer circuit having a dielectric constant less than 5.5 and a thermal conductivity less than 0.011 cal/sec cm° C.

* * * * *